United States Patent [19]

McGuire et al.

[11] Patent Number: 4,599,600

[45] Date of Patent: Jul. 8, 1986

[54] CONVERSION OF QUADRATURE SIGNALS INTO COUNTER CONTROL PULSES

[75] Inventors: Donald W. McGuire, Dover; Harry B. Cordes, York, both of Pa.

[73] Assignee: Red Lion Controls, York, Pa.

[21] Appl. No.: 544,690

[22] Filed: Oct. 24, 1983

[51] Int. Cl.[4] ............................................. H03K 5/26
[52] U.S. Cl. .................................. 340/347 P; 328/133
[58] Field of Search ............... 340/347 P; 377/43, 53; 328/133

[56] References Cited

U.S. PATENT DOCUMENTS

| | | | |
|---|---|---|---|
| 4,300,039 | 11/1981 | Avins | 340/347 P |
| 4,308,500 | 12/1981 | Avins | 340/347 P |
| 4,328,463 | 5/1982 | Avins | 340/374 P |
| 4,379,221 | 4/1983 | Avins et al. | 340/347 P |
| 4,442,532 | 4/1984 | Takemura | 340/347 P |
| 4,446,389 | 5/1984 | Williams et al. | 328/133 |

Primary Examiner—Clifford C. Shaw
Attorney, Agent, or Firm—N. J. Aquilino

[57] ABSTRACT

A method and apparatus for conversion of quadrature signals into counter control pulses including count and direction pulses. The method includes the steps of determining the relative states of the two quadrature pulses and which of the two had the transition, comparing these two determinations to resolve direction, and generation of a count pulse for every quadrature transition. The apparatus includes logic components which provide quadrature counting with an anti-jitter feature by change of the direction of transition on either input. By a technique of dynamically operating on both edges of the quadrature pulse train and the count signal, the counter control signals are produced without storage of the quadrature train or the need to know the current state of the quadrature train.

3 Claims, 9 Drawing Figures

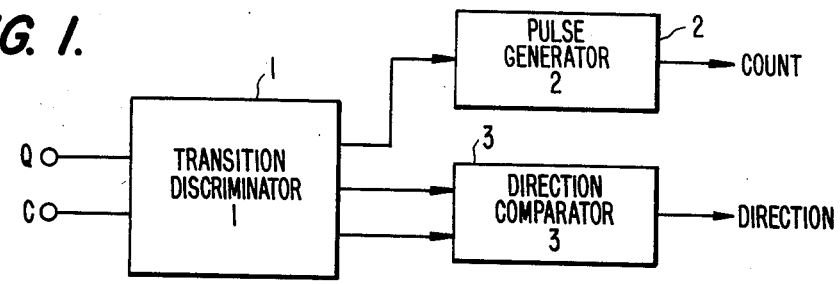
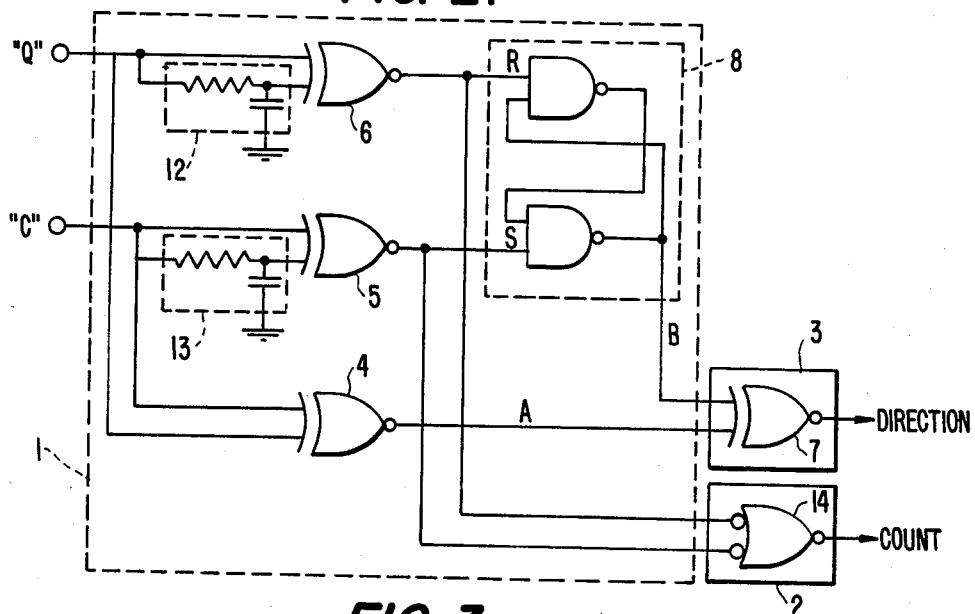
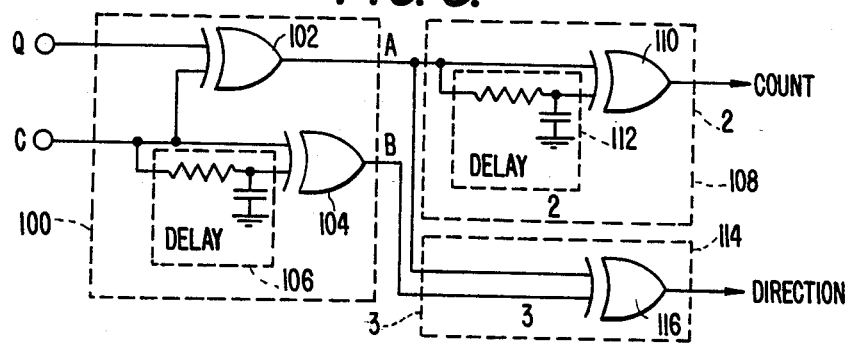
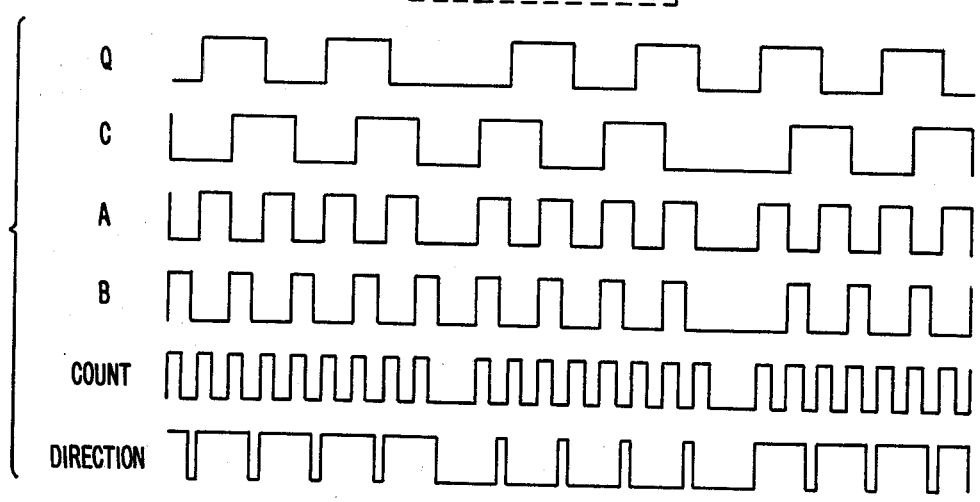

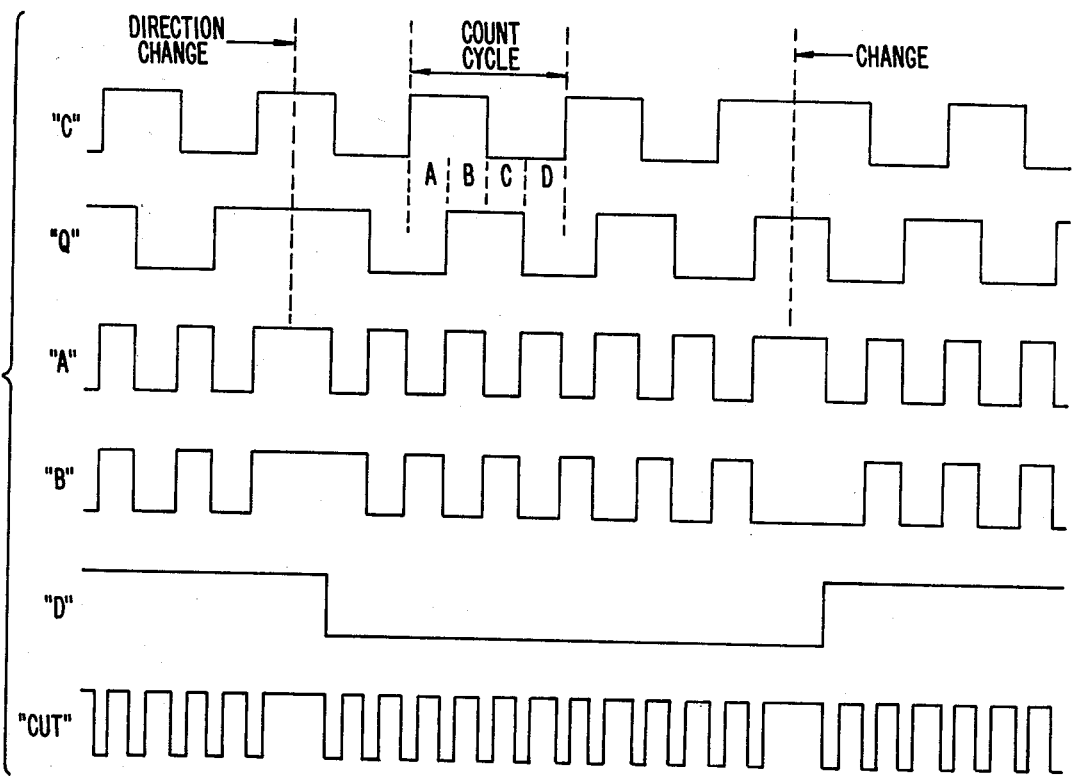
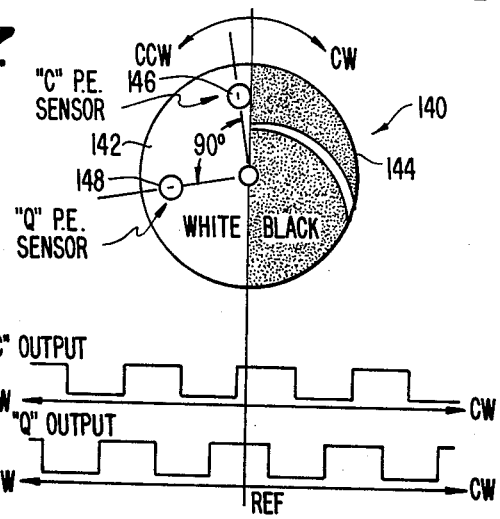
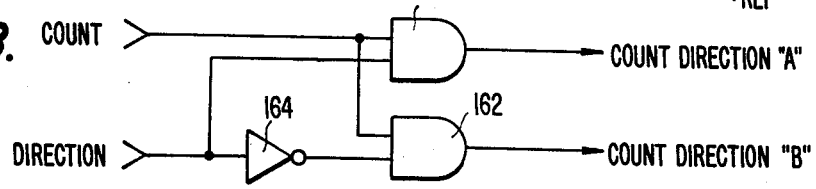
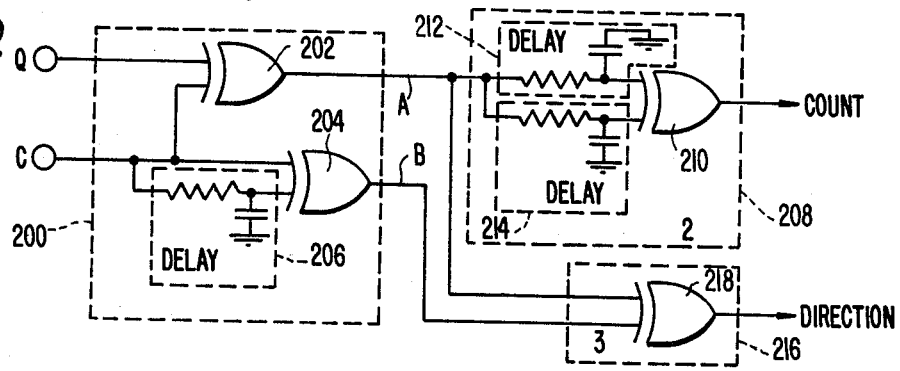

CONVERSION OF QUADRATURE SIGNALS INTO COUNTER CONTROL PULSES

BACKGROUND OF THE INVENTION

The invention relates to a quadrature to counter control pulse converters and in particular the method and apparatus to perform the conversion in a basic number of steps with minimum logic modules and increased resolution.

The term quadrature is known in the prior art to describe two signals generated from a sensor or configuration of sensors usually on a rotating member that have a 90 degree phase shift relationship to each other. The quadrature pulse train is used to provide direction and count information to counters or position indicators and controls. Raw, unprocessed quadrature pulses can be used directly into Up/Down counters by applying one channel to the count input and the other to the Up/Down control input. However, if any degree of vibration or rotary oscillation is present, the edge of the drive member may move back and forth across the count sensor several times. This causes the sensing of additional erroneous counts called "jitter".

There are known techniques to eliminate the effects of jitter by determining direction of count through storing of the state of the quadrature signals and comparing this stored data to the state of the quadrature signals after a transition. There are also known techniques for increasing resolution by a factor of two by operating on both edges of one of channels of the quadrature pulse train, and also by a factor of four by operating on both edges of both channels of the quadrature pulse train. What is needed is a technique for eliminating jitter and increasing resolution without the complexity of the storage of the quadrature pulse train which requires considerable digital logic components.

BRIEF DESCRIPTION OF INVENTION

A technique and digital logic for processing a quadrature pulse train is disclosed which operates on both edges of the pulses from each of the two sensor signals which are displaced 90 degrees in phase relationship. By operating on both edges of the quad (Q) signal and also the count (C) signal, four times the normal resolution of handling the unprocessed quadrature pulses is obtained. The technique involves the generation of a count pulse every time there is a transition at either input and determining direction of count by logical analysis of which input changed, and what the relative state of the inputs are immediately after the change.

The steps are:

(1) Determine the relative states of the two components of the quadrature pulse train.

(2) Determine in which of the two components of the quadrature pulse train the transition occurred.

(3) Compare the results of these two determinations to resolve the direction of motion.

(4) Generate a count pulse for every transition of the quadrature pulse train.

It can be seen from these steps that knowledge of the actual state of either component of the quadrature train is not necessary nor does storage of the train need to be performed.

Count direction output and count output can be used to control bi-directional counters and also be logically combined to produce a count-up pulse train and a count-down pulse train.

The foregoing and other features and objects which are considered characteristic of the invention will be best understood from the following detailed description when taken in conjunction with the accompanying drawings.

BRIEF DESCRIPTION OF THE DRAWINGS

FIG. 1 is a block diagram of the quadrature conversion system;

FIG. 2 is a schematic of the most preferred embodiment of the invention;

FIG. 3 is a schematic of the simplest embodiment of the invention;

FIG. 4 is a pulse sequence diagram of the simplest embodiment;

FIG. 5 is a pulse sequence diagram of the most preferred embodiment;

FIG. 6 is a diagram of the direction logic table;

FIG. 7 is a diagram of a typical quadrature operation;

FIG. 8 is the logic for decoding of direction counts;

FIG. 9 is a diagram of the system with delay of the leading edge of count.

DESCRIPTION OF THE PREFERRED EMBODIMENTS

Referring to FIG. 1, the basic quadrature conversion system is shown in the combination of transition discriminator 1, a pulse generator 2 and a direction comparator 3. In FIG. 2, the two quadrature pulse train inputs Q and C are applied to the transition discriminator 1 with "Q" pulses going to an EX-NOR gate 6, an R/C delay unit 12 and an EX-NOR gate 4 and "C" pulses going to an EX-NOR gate 5, an R/C delay unit 13 and EX-NOR gate 4. The output of EX-NOR gate 5 is connected to one input of a negative OR gate 14 and also to the "S" input of a R/S flip-flop 8. The output of EX-NOR gate 6 is connected to the other input of the negative OR gate 14 and also to the "R" input of the R/S flip-flop 8. The output of EX-NOR gate 4 is connected to one input of a EX-NOR gate 7 in the direction comparator 3, by way of line A. The output of flip-flop 8 is connected via line B to the other input of the EX-NOR gate 7.

FIG. 3 illustrates a schematic of a second embodiment of the present invention in a simple form. A transition discriminator 100 is formed of an EX-OR gate 102, EX-OR gate 104 and a R/C delay unit 106. A pulse generator 108 includes an EX-OR gate 110 and R/C delay unit 112. A direction comparator 114 includes an EX-OR gate 116. Quadrature train pulse input Q is applied to one input of EX-OR gate 102. Quadrature pulse train input C is applied to the other input of EX-OR gate 102, one input of EX-OR gate 104 and to delay unit 106. The output of delay unit 106 is applied to the other input of EX-OR gate 104. The output of EX-OR gate 102 is fed over line A to one input of EX-OR gate 110 in the pulse generator 108, to delay unit 112, and to one input of EX-OR gate 116 in the direction comparator 114. The output of delay unit 112 is connected to the second input of EX-OR gate 110. The output of EX-OR gate 104 is fed over line B to the second input of EX-OR gate 116.

FIGS. 4 and 5 are pulse sequence diagrams of the most preferred embodiment shown in FIG. 2 and the simplest embodiment shown in FIG. 3, respectively.

FIG. 6 is a diagram of the direction logic table which illustrates the condition of the direction line D from the output of EX-NOR gate 7 in the direction comparator for various combinations of quadrature input pulses Q and C and comparator input pulses A and B.

FIG. 7 illustrates a typical quadrature signal generator and the C and Q waveforms generated thereby. A typical chopper 140 includes a transparent section 142 and an opaque section 144. By using suitable light sources, photoelectric sensors 146 and 148 for the count signal and the quadrature signal, the waveforms shown are created from the reference line. It will be appreciated that rotation of the chopper 140 in a clockwise direction will produce the waveforms to the right of the reference line, whereas rotation of the chopper 140 in a counterclockwise direction will produce the waveforms to the left of the reference line.

FIG. 8 illustrates a logic circuit for decoding of the direction counts. Count signals are connected to a first input of AND gate 160 and to a first input of AND gate 162. Direction signals are applied to the second input of AND gate 160 and to an inverter 164 which in turn is connected to the second input of AND gate 162. The output of AND gate 160 provide count direction A and the output of AND gate 162 provides count direction B.

FIG. 9 illustrates another emobidment of the quadrature conversion system incorporating a delay of the leading edge of the count. A transition discriminator 200 includes an EX-OR gate 202, EX-OR gate 204 and a R/C delay unit 206. A pulse generator 208 includes an EX-OR GATE 210 and two R/C delay units 212 and 214. A direction comparator 216 includes an EX-OR gate 218. Quadrature train pulse input Q is applied to one input of EX-OR gate 202.

Quadrature pulse train input C is applied to the other input of EX-OR gate 202, to one input of EX-OR gate 204 and to R/C delay unit 206. The output of the delay unit 206 is applied to the other input of EX-OR gate 204. The output of EX-OR gate 202 is fed over line A to delay unit 212, delay unit 214, and one input of EX-OR gate 218. Delay unit 212 is connected to one input of EX-OR gate 210 and delay unit 214 is connected to the second input of EX-OR gate 218. The use of two delay units 212 and 214 in the pulse generator 208 provides a delay of the leading edge of the count.

The operation of the basic quadrature conversion system may be described as follows. The quadrature pulse train is comprised of pulses Q and C. The transitions on the "C" line are applied to one input of EX-NOR gate 5 directly and to the other input of EX-NOR gate 5 via delay unit 13. The output of EX-NOR gate 5 will be driven to a low state by the first "C" transition as a result of both inputs being not equal. At the time the delayed transition is sensed by EX-NOR gate 5, the output will be driven high since both inputs are equal. This delay duration is adjusted to provide the set-up time requirements of the counter being driven. The output of EX-NOR gate 5 drives one output of negative OR gate 14. The output of neg-OR gate 14 is a negative pulse used to drive the count input to a counter (not shown) which will respond to the rising trailing edge. The pulse output of EX-NOR gate 5 is also applied to the set (S) input of the R/S flip-flop 8 which causes the flip-flop output (B) to be driven to a high state.

The action of EX-NOR gate 7 in response to a transition at the "Q" input is similar to the "C" input to EX-NOR gate 5, except that the output connected to the reset (R) input of the R/S flip-flop 8 drives the output (B) to a low state.

With this combination of logic, any time a transition occurs at input "C", a negative pulse will be generated at the "count" output and the "B" line will be driven to a high state and when a transition occurs at input "Q", a negative pulse will be generated at the "count" output and the "B" line will be driven to a low state.

The "Q" and "C" quadrature inputs are also connected to EX-NOR gate 4 where a comparison of the pulses takes place. The output line "A" will be in the high state when "Q" and "C" are equal and in the low state when "Q" and "C" are not equal. The output "A" is in turn compared with the "B" line in EX-NOR gate 7. The output of EX-NOR gate 6 is the direction line "D" which is used as the direction input to a counter. The state of line "D" is illustrated in directional the logic table shown in FIG. 6.

The operation of the embodiments shown in FIGS. 3 and 9 are essentially the same as the operation of the embodiment of FIG. 2 except that FIG. 3 is a simpler circuit and FIG. 9 includes the delay feature described hereinabove.

It will be appreciated that the above embodiments are exemplary of the invention and modifications or changes may be made in keeping within the scope of the following claims.

We claim:

1. A system for converting a quadrature pulse train into first and second counter control signals comprising:
    a transition discriminator which receives said quadrature pulse train composed of a first pulse component and a second pulse component;
    said transition discriminator having a first means including a first EX-NOR logic component with one input connected to said first pulse component and the other input connected to said second pulse component; wherein said first means is responsive to said quadrature pulse train to determine the relative state of said first and second pulse components for producing at the output of the first EX-NOR logic component an output of one logic state wherein said first and second pulse components are in the same state and for producing an output of the opposite logic state when said first and second pulse components are not in the same state;
    said transition discriminator further having a second means comprising a RS flip-flop which will be in a first logic state when a transition occurs in one of said pulse component means and will be in the opposite logic state when a transition occurs in the other of said pulse component means;

said transition discriminator also having a third means including a second EX-NOR logic component with one input connected to said first pulse component and the other input connected through a first delay unit to said first pulse component and with the output connected to the R input of the RS flipflop, and also including a third EX-NOR logic component with one input connected to said second pulse component and the other input connected through a second delay unit to said second pulse component and with the output connected to the S input of the RS flipflop wherein said third means is responsive to said quadrature pulse train to detect a transition in either of said first or second pulse components;

a direction comparator including a fourth EX-NOR logic unit with one input connected to the output of said RS flip-flop and the other input connected to the output of said first means, said direction comparator being responsive to said first means and to said second means in said transition discriminator means for generating a direction pulse train which has a first logic state when the moving member of the quadrature pulse train generator is traveling in one direction and which has a second logic state when said moving member is traveling in the opposite direction; a pulse generator including a negative connected OR logic unit with one input connected to said third means second EX-NOR logic component output and a second input connected to said third means third EX-NOR logic component output, said pulse generator responsive to the output of said third means in the transition discriminator for generating a count pulse train in which the number of pulses equals the total number of transitions in said quadrature pulse train;

wherein said first counter control signals are the count pulse train from said pulse generator with a total number of pulses equal to the number of pulse edges in said quadrature pulse train and said second counter control signals are the direction pulse train from said direction comparator which indicate the direction of travel of said moving member of the quadrature pulse train generator.

2. The converter system of claim 1 wherein said first delay unit and said second delay unit each comprise an R C network.

3. The converter system of claim 1 wherein said first delay unit and second second delay unit each comprise active circuit elements.

* * * * *